United States Patent
Hu et al.

(10) Patent No.: US 9,728,520 B2
(45) Date of Patent: Aug. 8, 2017

(54) ENHANCED FLASH CHIP AND METHOD FOR PACKAGING CHIP

(71) Applicant: GIGADEVICE SEMICONDUCTOR (BEIJING) INC., Beijing (CN)

(72) Inventors: Hong Hu, Beijing (CN); Qingming Shu, Beijing (CN); Sai Zhang, Beijing (CN); Jianjun Zhang, Beijing (CN); Jiang Liu, Beijing (CN); Ronghua Pan, Beijing (CN)

(73) Assignee: GIGADEVICE SEMICONDUCTOR (BEIJING) INC., Beijing (CN)

( * ) Notice: Subject to any disclaimer, the term of this patent is extended or adjusted under 35 U.S.C. 154(b) by 124 days.

(21) Appl. No.: 14/760,207

(22) PCT Filed: Jun. 21, 2013

(86) PCT No.: PCT/CN2013/077629
§ 371 (c)(1),
(2) Date: Jul. 10, 2015

(87) PCT Pub. No.: WO2014/166165
PCT Pub. Date: Oct. 16, 2014

(65) Prior Publication Data
US 2015/0348939 A1 Dec. 3, 2015

(30) Foreign Application Priority Data

Apr. 9, 2013 (CN) .......................... 2013 1 0121685

(51) Int. Cl.
*H01L 25/065* (2006.01)
*G06F 3/06* (2006.01)
(Continued)

(52) U.S. Cl.
CPC ........ *H01L 25/0655* (2013.01); *G06F 3/0626* (2013.01); *G06F 3/0632* (2013.01);
(Continued)

(58) Field of Classification Search
USPC .......................................... 438/107; 711/103
See application file for complete search history.

(56) References Cited

U.S. PATENT DOCUMENTS

| 9,396,798 B2 * | 7/2016 | Hu .......................... H01L 24/45 |
| 2012/0133381 A1 | 5/2012 | Bruland et al. |

FOREIGN PATENT DOCUMENTS

| CN | 1688019 A | 10/2005 |
| CN | 1700642 A | 11/2005 |

(Continued)

*Primary Examiner* — Marcos D Pizarro
*Assistant Examiner* — Lawrence Tynes, Jr.
(74) *Attorney, Agent, or Firm* — Gokalp Bayramoglu

(57) ABSTRACT

An enhanced Flash chip and a method for packaging chip are provided to solve the problems of high design complexity. The enhanced Flash chip comprises: a FLASH and a RPMC packaged integrally, wherein the same IO pins in the FLASH and in the RPMC are mutually connected and are connected to the same external sharing pin of the chip; an external instruction is transmitted to the FLASH and the RPMC through the external sharing pin of the chip, and the controller of the FLASH and the controller of the RPMC respectively judge whether to execute the external instruction; and the FLASH and the RPMC further comprise internal IO pins, respectively, the internal IO pins of the FLASH and the internal IO pins of the RPMC are mutually connected, and internal mutual communication between the FLASH and the RPMC is performed through the pair of mutually connected internal IO pins.

13 Claims, 2 Drawing Sheets

(51) Int. Cl.
*H01L 23/00* (2006.01)
*H01L 25/00* (2006.01)
*H01L 25/18* (2006.01)

(52) U.S. Cl.
CPC ............ *G06F 3/0679* (2013.01); *H01L 24/48* (2013.01); *H01L 25/0657* (2013.01); *H01L 25/18* (2013.01); *H01L 25/50* (2013.01); *G06F 2206/1014* (2013.01); *H01L 24/06* (2013.01); *H01L 24/32* (2013.01); *H01L 24/73* (2013.01); *H01L 2224/04042* (2013.01); *H01L 2224/05554* (2013.01); *H01L 2224/06135* (2013.01); *H01L 2224/32145* (2013.01); *H01L 2224/32225* (2013.01); *H01L 2224/48137* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06568* (2013.01); *H01L 2924/00014* (2013.01); *Y10T 29/413* (2015.01)

(56) References Cited

FOREIGN PATENT DOCUMENTS

| | | |
|---|---|---|
| CN | 1832121 A | 9/2006 |
| CN | 101488465 A | 7/2009 |
| CN | 102646085 A | 8/2012 |
| CN | 102820302 A | 12/2012 |
| CN | 202816942 U | 3/2013 |

* cited by examiner

ENHANCED FLASH CHIP AND METHOD FOR PACKAGING CHIP

TECHNICAL FIELD

The present application relates to the field of chip technology, and especially to an, enhanced Flash chip and a method for packaging chip.

BACKGROUND ART

The enhanced Flash (one type of memory chip) comprising RPMC (Replay Protection Monotonic Counter) is a featured BIOS (Basic Input-Output System) chip launched by the Intel. It comprises a Flash chip having large capacity and a RPMC circuit. Wherein, the capacity of the FLASH chip may be 8M, 16M, 32M, 64M, 128M, 256M or more in which codes and data of CPU (Central Processing Unit) and BIOS are stored; the RPMC circuit may guarantee the security and integrity of reading and writing data. The RPMC circuit and the FLASH integrated therein constitute the hardware platform of the BIOS of PC (Personal Computer) system.

At present, when designing the Flash chip with RPMC function, a designer usually integrates the Flash having large capacity and the RPMC into a single chip, which means that the RPMC circuit and the FLASH are designed together.

However, such a design manner has the following disadvantages: since the FLASH and the RPMC are required to be integrated into a single chip, the single chip may have a large size and a package thereof has a large size, causing an expensive cost; and the RPMC and the FLASH are designed together, resulting in a higher complexity and a longer period of chip design.

SUMMARY OF THE INVENTION

One of the objectives of the present application is to provide an enhanced Flash chip and a method for packaging chip to solve the problems of high design complexity, long design period and high design cost.

In order to solve above problems, is the present application provides an enhanced FLASH chip, which comprises:

a FLASH and a RPMC (Replay Protection Monotonic Counter) which are packaged integrally, wherein, the FLASH comprises an independent controller and the RPMC comprises an independent controller respectively;

the same IO pins in the FLASH and in the RPMC are mutually connected, and are connected to same external sharing pin(s) of the enhanced Flash chip;

an external instruction is transmitted to the FLASH and the RPMC through the external sharing pin(s) of the enhanced Flash chip, and the controller of the FLASH and the controller of the RPMC respectively judge whether to execute the external instruction; and the FLASH further comprises internal IO pin(s) and the RPMC further comprises internal IO pin(s) respectively, the internal IO pin(s) of the FLASH and the internal IO pin(s) of the RPMC are mutually connected, and internal mutual communication between the FLASH and the RPMC is performed through the pair of mutually connected internal IO pins.

Preferably, when the enhanced Flash chip receives a first external instruction through the external sharing pin(s), if the controller of the FLASH and the controller of the RPMC respectively judge that the FLASH and the RPMC both are required to execute the first external instruction, then the FLASH and the RPMC execute corresponding operation according to the first external instruction respectively;

if either one of the FLASH and the RPMC is required to execute the first external instruction, then during one of the FLASH and the RPMC executes the corresponding operation according to the first external instruction, if the enhanced Flash chip receives a second external instruction through the external sharing pin(s) which needs to be executed by the other one of the FLASH and the RPMC, then the other one of the FLASH and the RPMC executes corresponding operation according to the second external instruction.

Preferably, when the FLASH is executing the external instruction and the RPMC is idle, if the enhanced Flash chip receives a suspend instruction through the external sharing pin(s), then the controller of the FLASH judges that the FLASH is required to execute the suspend instruction, the controller of the RPMC judges that the RPMC is not required to execute the suspend instruction; and after suspending the operation being executed according to the suspend instruction, the FLASH sends a notification of the suspension to the RPMC through the pair of mutually connected internal IO pins, and after receiving the notification, the RPMC executes the suspend instruction to realize synchronization with the FLASH.

Preferably, the mutually connected internal IO pins refers to a plurality of the pairs of mutually connected internal IO pins; and the external sharing pin(s) of the enhanced Flash chip refers to a plurality of the external sharing pins.

Preferably, the FLASH further comprises an independent IO pin connected with the FLASH to realize the function of the FLASH, and the independent IO pin connected with the FLASH is connected to an external independent pin of the enhanced Flash chip; and the RPMC further comprises an independent IO pin connected with the RPMC to realize the function of the RPMC, and the independent IO pin connected with the RPMC is connected to another external independent pin of the enhanced Flash chip, wherein, the independent IO pin connected with the FLASH and the independent IO pin connected with the RPMC are not mutually connected.

Preferably, the same IO pins in the FLASH and in the RPMC being mutually connected, and being connected to same external sharing pin(s) of the enhanced Flash chip, comprises:

the IO pin a_x of the FLASH is mutually connected to the same IO pin b_y of the RPMC, and the IO pin a_x of the FLASH is connected to the same external sharing pin PAD_z of the enhanced Flash chip, or the same IO pin b_y of the RPMC is connected to the same external sharing pin PAD_z of the enhanced Flash chip, wherein, "a" indicates an IO pin of the FLASH, "x" indicates an IO pin mark of the FLASH; "b" indicates an IO pin of the RPMC and "y" indicates an IO pin mark of the RPMC; "PAD" indicates an IO pin packaged by the enhanced Flash chip and "z" indicates an IO pin mark of the IO pin packaged by the enhanced Flash chip.

According to another aspect, is the present application also provides a method for packaging chip in the present application, which comprises:

placing a FLASH and s RPMC (Replay Protection Monotonic Counter) to be packaged onto a chip carrier, the FLASH and the RPMC being mutually independent;

mutually connecting the same IO pins in the FLASH and in the RPMC by using metal lead wires;

connecting the mutually connected same IO pins to same external sharing pin(s) of the chip carrier by using metal lead wires;

mutually connecting internal IO pin(s) of the FLASH and internal IO pin(s) of the RPMC by using metal lead wire(s); and performing plastic package on the FLASH, the RPMC and the chip carrier to form a chip having the function of the RPMC.

Preferably, the method further comprises:

connecting an independent IO pin in the FLASH for realizing the function of the FLASH to an external independent pin of the chip carrier by using metal lead wire(s); and connecting an independent IO pin of the RPMC for realizing the function of the RPMC to another external independent pin of the chip carrier by using metal lead wire(s), wherein, the independent IO pin of the FLASH is not connected with the independent IO pin of the RPMC.

Preferably, the step of connecting the mutually connected same IO pins to the same external sharing pin(s) of the chip carrier by using metal lead wires, comprises:

connecting the IO pin a_x of the FLASH to the same external sharing pin PAD_z of the chip carrier by using metal lead wire(s), or connecting the same IO pin b_y of the RPMC to the same external sharing pin PAD_z of the chip carrier by using metal lead wire(s), wherein, the IO pin a_x of the FLASH and the IO pin b_y of the RPMC are mutually connected same IO pins, and "a" indicates an IO pin of the FLASH, "x" indicates an IO pin mark of the FLASH; "b" indicates an IO pin of the RPMC and "y" indicates an IO pin mark of the RPMC; "PAD" indicates an IO pin packaged by the enhanced Flash chip and "z" indicates an IO pin mark of the IO pin packaged by the enhanced Flash chip.

Preferably, the step of placing a FLASH and a RPMC to be packaged onto a chip carrier, comprises:

placing the FLASH and the RPMC onto the chip carrier side by side, or vertically stacking the FLASH and the RPMC on the chip carrier;

when the FLASH and the RPMC are vertically stacked on the chip carrier, if the size of the FLASH is larger than that of the RPMC, then the RPMC is vertically stacked on the FLASH; and if the size of the RPMC is larger than that of the FLASH, then the FLASH is vertically stacked on the RPMC.

According to still another aspect, the present application, also provides a computer readable recording medium in which a program used to execute the above method according to the present application is recorded.

Compared with the prior art, the present application may have advantages as follows:

1. The enhanced Flash chip proposed by the embodiments of the present application is to integrally package the FLASH and the RPMC, wherein, the FLASH circuit and the RPMC circuit respectively comprise an independent controller; the same IO pins of the FLASH and the RPMC are mutually connected, and connected to the same external sharing pins of the enhanced Flash chip; an external instruction is transmitted to the FLASH and the RPMC through the external sharing pins of the enhanced Flash chip, and the controller of FLASH and the controller of the RPMC respectively judge whether to execute the external instruction; and the FLASH and the RPMC further comprise internal IO pins respectively, in which the internal IO pins of the FLASH and the same internal IO pins of the RPMC are mutually connected, and the internal mutual communication between the FLASH and the RPMC is performed through a pair of mutually connected internal IO pins. In the embodiments of the present application, since the FLASH and the RPMC are packaged integrally, the package size and the design cost can be reduced; moreover, since the existing FLASH chips can be reused as the circuit modules of the FLASH and the designer only needs to design RPMC circuit modules, it is possible to reduce the complexity of chip design, shorten the design period and reduce the cost.

2. The internally mutual communication between the FLASH and the RPMC can be performed through a pair of mutually connected internal IO pins. Thus, when either one of the FLASH and the RPMC is executing the external instruction while the other one is idle, if a suspend instruction is received through the external sharing pins, then the one which is executing the external instruction will execute the suspend instruction and will send a notification of its suspension to other one which is idle through the pair of mutually connected internal IO pins, such that the other one which is idle will also execute the suspend instruction, whereby ensuring the synchronization between the FLASH and the RPMC.

3. The FLASH and the RPMC may also execute different instructions simultaneously, that is, the FLASH and the RPMC can be operated in parallel, in such a manner that the performance of the chip could be improved.

4. The FLASH and the RPMC made by different processes can be integrally packaged in a manner of multi-chip packaging, such that the existing resources can be reused so as to reduce the development cost.

5. The capacity of the FLASH is extendable; for example, the capacity of a single FLASH could be increased or a plurality of FLASH could be packaged integrally.

DETAILED DESCRIPTION OF THE EMBODIMENTS

Figure 1:
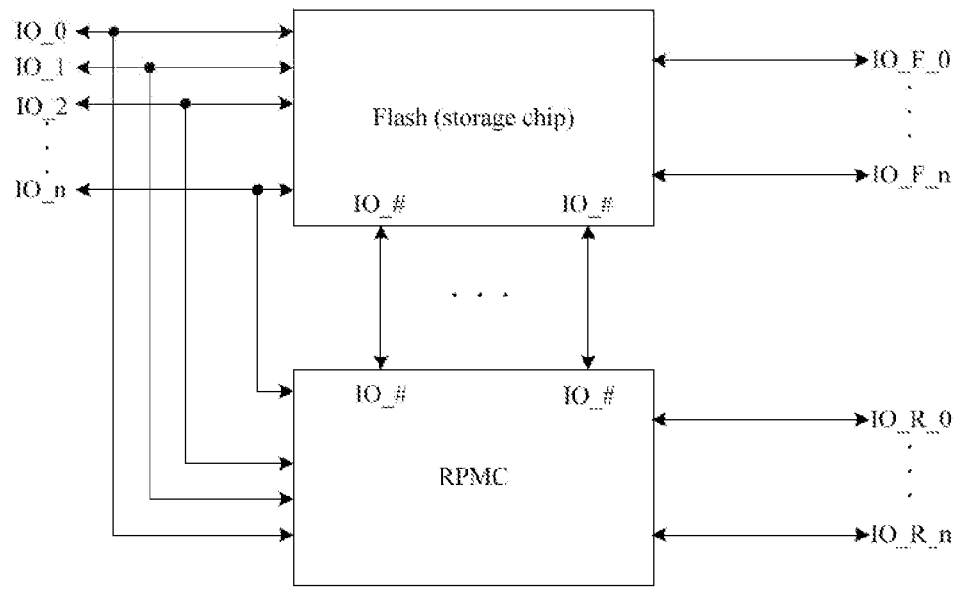
FIG. 1 is a schematic diagram showing a logical connection of an enhanced Flash chip according to a second embodiment of the present application.

In order to more apparently understand above purposes, features and advantages of the present application set forth herein, the detailed description thereof will be provided below in connection with the accompanying drawings and specific embodiments.

The embodiment of the present application proposes an enhanced Flash chip that can realize a RPMC function by a multi-chip packaging method, in which on the basis of a FLASH chip, the RPMC and the FLASH chip are packaged integrally to hence constitute an enhanced Flash chip with RPMC function, such that the RPMC and the FLASH may be allowed to share common pins. The embodiments of the present application may reduce the complexity and the cost of chip design. Further, an internal mutual communication between the FLASH and the RPMC can be performed through a pair of mutually connected internal IO pins, whereby ensuring the synchronization between the RPMC and the FLASH.

First Embodiment

The first embodiment of the present application proposes an enhanced Flash chip which may comprise a FLASH and a RPMC packaged integrally.

In the embodiment of the present application, the FLASH and the RPMC may be independent chips. The FLASH may be selected to have different capacities to satisfy the requirements of various systems. The FLASH can reuse designed FLASH chips so that there is no need to redesign, thereby greatly reducing the design period; the RPMC is provided with the function of replay protection monotonic counter and thus can be used independently.

In the enhanced Flash chip provided by the embodiments of the present application, the FLASH can comprise an independent controller and the RPMC can comprise an independent controller, respectively. In response to an external instruction, the FLASH and the RPMC may control the FLASH and the RPMC to receive and decode by the independent controllers, respectively. If the decoding is completed, corresponding operations will be executed.

In addition, the FLASH and the RPMC may have the same IO (Input/Output) pins which may be mutually connected and be connected to the same external sharing pins of the enhanced Flash chip. In this embodiment of the present application, the same IO pins in the FLASH and the RPMC may refer to IO pins having same functions. For example, an IO pin CE in the FLASH can realize a function of SPI (Serial Peripheral Interface) and an IO pin CSE in the RPMC can also realize the function of the SPI interface; at this point, the IO pin CE in the FLASH and the IO pin CSE in the RPMC may be the same IO pin and thus are possible to be mutually connected.

An external instruction may be transmitted to the FLASH and the RPMC through the external sharing pins of the enhanced Flash chip, and then the controller of the FLASH and the controller of the RPMC may respectively judge whether to execute the external instruction, and may control the FLASH and the RPMC to execute corresponding operations according to the judgment result.

In this embodiment of the present application, the FLASH may further comprise internal IO pins and the RPMC may further comprise internal IO pins, respectively. The internal IO pins of the FLASH and the internal IO pins of the RPMC may be mutually connected, such that internal mutual communication between the FLASH and the RPMC can be performed through a pair of mutually connected internal IO pins, whereby ensuring the synchronization between the FLASH and the RPMC.

Herein, the mutual connection between the internal IO pins of the FLASH and the RPMC may refer to a mutual connection between internal IO pins indicating the same status bit in the FLASH and the RPMC.

For example, an internal IO pin IO_0 of the FLASH is used to output a status bit "busy" and an internal IO pin IO_2 of the RPMC is used to input the status bit "busy". Thus, the internal IO pin IO_0 of the FLASH may be mutually connected to the internal IO pin IO_2 of the RPMC, such that the IO_0 and the IO_2 is a pair of mutually connected internal IO pins. After being mutually connected, the FLASH may output its status bit "busy" to the internal IO pin IO_2 of the RPMC through its internal IO pin IO_0, such that the RPMC may obtain the current status of the FLASH.

As another example, an internal IO pin IO_1 of the FLASH is used to input the status bit "busy" and an internal IO pin IO_3 of the RPMC is used to output the status bit "busy". Thus, the internal IO pin IO_1 of the FLASH may be mutually connected to the internal IO pin IO_3 of the RPMC, such that the IO_1 and the IO_3 is a pair of mutually connected internal IO pins. After being mutually connected, the RPMC may output its status bit "busy" to the internal IO pin IO_1 of the FLASH through the internal IO pin IO_3 in the RPMC, such that the FLASH may obtain the current status of the RPMC.

The enhanced Flash chip will be described in detail in following embodiments.

In the embodiment of the present application, since the FLASH and the RPMC are packaged integrally, the package size and design cost can be reduced. Moreover, since the existing FLASH chips can be reused as the FLASH circuit modules and the designer only needs to design RPMC circuit modules, it is possible to reduce the complexity of chip design, shorten the design period and reduce the cost. Moreover, the internal mutual communication between the FLASH and the RPMC can be performed through a pair of mutually connected internal IO pins, whereby ensuring the synchronization between the FLASH and the RPMC.

Second Embodiment

Hereinafter, the enhanced Flash chip will be explained in detail by way of the second embodiment of the present application.

FIG. 1 shows a schematic diagram of the logical connection of the enhanced Flash chip according to the second embodiment of the present application.

As could be seen from FIG. 1, the enhanced Flash chip according to the embodiment of the present application may comprise a FLASH and a RPMC which are packaged integrally.

Herein, the FLASH and the RPMC each comprises a plurality of pins, and the same IO pins in the RPMC and the FLASH may be connected to the same set of external sharing pins. The RPMC and the FLASH may receive an instruction from outside simultaneously and response thereto correspondingly. The FLASH and the RPMC may further comprise internal IO pins, respectively, such that the internal IO pins of the FLASH and the internal IO pins of the RPMC may be mutually connected with each other. The RPMC and the FLASH may also be provided with independent IO pins, respectively. When the two chips are packaged integrally, a FLASH having RPMC function may be realized.

In the embodiment of the present application, the pins of the chips may be involved in the following three types.

1. External Sharing Pin

In the embodiment of the present application, the FLASH and the RPMC have the same IO pins, such that the same IO pins in the FLASH and the RPMC may be connected mutually and be connected to the same external sharing pin of the chip. A plurality of the external sharing pins may be provided.

For example, IO_0, IO_1, . . . , IO_n in FIG. 1 are external sharing interfaces of the chip, and IO interfaces in the FLASH connected to IO_0, IO_1, . . . IO_n and IO interfaces in the RPMC connected to IO_0, IO_1, . . . , IO_n are the same IO interfaces in the FLASH and the RPMC.

It should be explained that, since FIG. 1 is the schematic diagram of the logical connection of the enhanced Flash chip, the IO_0, the IO_1, . . . , the IO_n therein may all be referred to as interfaces. These interfaces in the diagram of the logical connection may in turn be referred to as pins in physical connection of the enhanced Flash chip.

In the embodiment of the present application, the FLASH and the RPMC each comprises an independent controller. An external instruction may be transmitted to the FLASH and the RPMC through the external sharing pins of the enhanced Flash chip, and the controller of the FLASH and the controller of the RPMC judge whether to execute the external instruction, respectively.

Preferably, when the enhanced Flash chip receives an external instruction through the external sharing pins, the following processes can be executed:

when the enhanced Flash chip receives a first external instruction through the external sharing pins, if the controller of the FLASH and the controller of the RPMC respectively judge that the FLASH and the RPMC both are required to execute the first external instruction, then the FLASH and the RPMC will execute corresponding operations according to the first external instruction, respectively;

if either one of the FLASH and the RPMC is required to execute the first external instruction, then during the FLASH or the RPMC executes the corresponding operations according to the first external instruction, if the enhanced Flash chip receives a second external instruction through the external sharing pins which needs to be executed by the other one of the FLASH and the RPMC, then the other one of the FLASH and the RPMC will execute corresponding operations according to the second external instruction.

For example, if the enhanced Flash chip receives an external instruction a, then the external instruction a will be transmitted to the FLASH and the RPMC through the external sharing pins, respectively, and the controller of the FLASH and the controller of the RPMC both may judge whether to execute the external instruction. If the controller of FLASH judges that the FLASH is required to execute the external instruction a and the controller of the RPMC judges that, the RPMC is required to execute the external instruction a, then the FLASH and the RPMC may simultaneously execute the operations corresponding to the external instruction a according to the external instruction a.

If the enhanced Flash chip receives an external instruction b (for example, PROGRAM or ERASE), at this point the controller of the FLASH judges that the FLASH is required to execute the external instruction b and the controller of the RPMC judges that the RPMC is not required to execute the external instruction b, then the FLASH will execute the operations corresponding to the external instruction b according to the external instruction b. During the FLASH executes the external instruction b, if the enhanced Flash chip receives another external instruction c, the controller of FLASH judges that the FLASH is not required to execute the external instruction c and the controller of the RPMC judges that the RPMC is required to execute the external instruction c, then the RPMC will execute the operations corresponding to the external instruction c according to the external instruction c.

Similarly, if the enhanced Flash chip receives an external instruction d, at this point the controller of the FLASH judges that the FLASH is not required to execute the external instruction d and the controller of the RPMC judges that the RPMC is required to execute the external instruction d, then the RPMC will execute the operations corresponding to the external instruction d according to the external instruction d. During the RPMC executes the external instruction d, if the enhance Flash chip receives another external instruction e, the controller of the FLASH judges that the FLASH is required to execute the external instruction e and the controller of the RPMC judges that the RPMC is not required to execute the external instruction e, then the FLASH will execute the operations corresponding to the external instruction e according to the external instruction e.

Thus, through above processes, the FLASH and the RPMC may simultaneously execute same or different instructions in such a manner that the FLASH and the RPMC may execute instructions in parallel. For example, during the FLASH executes a PROGRAM or ERASE, the RPMC may execute the instructions.

2. Pair of Mutually Connected Internal IO Pins

In the embodiment of the present application, the FLASH and the RPMC may further comprise respective internal IO pins. The internal IO pins of the FLASH and the internal IO pins of the RPMC may be mutually connected, such that the internal mutual communication between the FLASH and the RPMC can be performed through a pair of mutually connected internal IO pins.

For example, in FIG. 1, the internal IO interface (i.e., pin) IO_# in the FLASH and the internal IO interface IO_# mutually connected thereto in the RPMC may constitute a pair of mutually connected internal IO interfaces (i.e., a pair of mutually connected internal IO pins) of the enhanced Flash chip. A plurality of pairs of mutually connected internal IO interfaces may be provided. The internal mutual communication between the FLASH and the RPMC may be performed through the internal IO interfaces IO_# in the FLASH and the internal IO interfaces IO_# mutually connected thereto in the RPMC.

In the embodiment of the present application, the internal mutual communication between the FLASH and the RPMC can be performed through a pair of mutually connected internal IO pins. For example, the internal IO pin IO_0 used to output the status bit "busy" in the FLASH and the internal IO pin IO_2 used to input the status bit "busy" in the RPMC may be mutually connected; and the internal IO pin IO_1 used to input the status bit "busy" in the FLASH and the internal IO pin IO_3 used to output the status bit "busy" in the RPMC may also be mutually connected. IO_0 and IO_2 as well as IO_1 and IO_3 are the pairs of mutually connected internal IO pins, respectively. Thus, the internal mutual communication between the FLASH and the RPMC may be performed through the pairs of mutually connected internal IO pins IO_0 and IO_2 as well as IO_1 and IO_3, such that a value of the status bit "busy" of one of the pins may be sent to the other one of the pins.

Thus, when either one of the FLASH and the RPMC is executing external instruction the one which is executing the external instruction is busy and the other one is idle, if a suspend instruction is received through the external sharing pins, Case 1). If the busy one execute the suspend instruction and will send a notification of its suspension to the other one which is idle through the pair of mutually connected internal IO pin that marking suspend status bit, such that the other one which is idle will also execute the suspend instruction, whereby ensuring the synchronization between the FLASH and the RPMC. Case 2) If the busy one do not execute the suspend instruction and will not send a notification of its suspension to the other one which is idle through the pair of mutually connected internal IO pin that marking suspend status bit, such that the other one which is idle will not, execute the suspend instruction, whereby ensuring the synchronization between the FLASH and the RPMC.

Preferably, the synchronization processes between the FLASH and the RPMC may comprise:

when the FLASH is executing the external instruction and the RPMC is idle, if the enhanced Flash chip receives a suspend instruction through the external sharing pins, then the controller of the FLASH may judge that the FLASH is required to execute the suspend instruction, and the controller of the RPMC may judge that the RPMC is not required to execute the suspend instruction;

after suspending the operation being executed according to the suspend instruction, the FLASH may send a notification of the suspension to the RPMC through the pair of mutually connected internal IO pins, and after receiving the notification, the RPMC may execute the suspend instruction to realize synchronization with the FLASH.

Or, when the RPMC is executing the external instruction and the FLASH is idle, if the enhanced Flash chip receives a suspend instruction through the external sharing pins, then the controller of the FLASH may judge that the FLASH is not required to execute the suspend instruction, and the controller of the RPMC may judge that the RPMC is required to execute the suspend instruction;

after suspending the operation being executed according to the suspend instruction, the RPMC may send a notification of its suspension to the FLASH through the pair of mutually connected internal IO pins, and after receiving the notification, the FLASH may execute the suspend instruction to realize synchronization with the RPMC.

For example, the FLASH is in a "busy" state, and the RPMC is in an "idle" state:

When the enhanced Flash chip receives an external instruction A through the external sharing pins, the controller of the FLASH judges that the FLASH is required to execute the external instruction A, and the controller of the RPMC judges that the RPMC, is not required to execute the external instruction A. In this case, the FLASH may execute an operation corresponding to the external instruction A according to the external instruction A, the status bit of the FLASH which is executing the external instruction A is set to busy=1, and the status bit of the RPMC which is in idle state is set to busy=0.

At this point, if the enhanced Flash chip receives a suspend instruction through the external sharing pins, since the FLASH is in a busy state and the RPMC is in an idle state, the controller of the FLASH judges that the FLASH is required to execute the suspend instruction and the controller of the RPMC judges that the RPMC is not required to execute the suspend instruction, and then the FLASH may suspend the operation being executed according to the suspend instruction.

After suspending the operation being executed according to the suspend instruction, the FLASH may send a notification of its suspension to the RPMC through the pair of mutually connected internal IO pins, and after receiving the notification, the RPMC obtains that the FLASH in the state of busy=1 has suspended, such that the RPMC may execute the suspend instruction so as to realize synchronization with the FLASH.

The FLASH is in an idle state, and the RPMC is in a busy state:

When the enhanced Flash chip receives an external instruction B through the external sharing pins, the controller of the FLASH judges that the FLASH is not required to execute the external instruction B, and the controller of the RPMC judges that the RPMC is required to execute the external instruction B. In this case, the RPMC may execute an operation corresponding to the external instruction B according to the instruction B, the status bit of the RPMC which is executing the external instruction B is set to busy=1, and the status bit of the FLASH which is in idle state is set to busy=0.

At this point, if the enhanced Flash chip receives a suspend instruction through the external sharing pins, since the FLASH is in an idle state and the RPMC is in a busy state, the controller of the FLASH judges that the FLASH is not required to execute the suspend instruction and the controller of the RPMC judges that the RPMC is required to execute the suspend instruction; and then the RPMC may suspend the operation being executed according to the suspend instruction.

After suspending the operation being executed according to the suspend instruction, the RPMC may send a notification of its suspension to the FLASH through the pair of mutually connected internal IO pins, and after receiving the notification, the FLASH obtains that the RPMC in the state of busy=1 has suspended, such that the FLASH may execute the suspend instruction so as to realize synchronization with the RPMC.

However, if there is no pair of mutually connected internal IO pins in the chip, then the suspended FLASH cannot inform the RPMC (or the suspended RMPC cannot inform the FLASH). Thus, after receiving the suspend instruction, the RPMC (or the FLASH) in the idle state may ignore the suspend instruction, which may result in that the RPMC still executes subsequently received instructions. However, the FLASH (or the RPMC) cannot execute the subsequently received instructions due to its suspension, causing an asynchronous problem between the FLASH and the RPMC.

Moreover, if the FLASH and the RPMC are both in a busy state (that is, the FLASH and the RPMC are both executing the corresponding operations according to the external instruction), then, if the enhanced Flash chip receives a suspend instruction through the external sharing pins, the controller of the FLASH judges that the FLASH is required to execute the suspend instruction and the controller of the RPMC judges that the RPMC is required to execute the suspend instruction. In this case, each of the FLASH and the RPMC may suspend the operation being executed according to the suspend instruction, and send a notification of its suspension to each other through the pair of mutually connected internal IO pins.

3. External Independent Pins

In the embodiment of the present application, the external independent pins in the enhanced Flash chip may be involved in the following two types.

(1) External Independent Pins Related to the FLASH

In the embodiment of the present application, the FLASH may further comprise an independent IO pin connected with the FLASH to realize the function of the FLASH. The independent IO pin connected with the FLASH is connected to, the external independent pin (that is, the external independent pin related to the FLASH) of the enhanced Flash chip.

For example, in FIG. 1, IO_F_0, . . . , IO_F_0 are the external independent interfaces (i.e., pins) in the enhanced Flash chip related to the FLASH, and the IO interfaces in the FLASH connected with the IO_F_0, . . . , IO_F_0 are the independent IO interfaces connected with the FLASH.

In the embodiment of the present application, an external instruction may be transmitted to the FLASH through the external independent pins in the enhanced Flash chip related to the FLASH. The controller of the FLASH may judge whether the FLASH is required to execute the external instruction. If required, the FLASH may execute the corresponding operations according to the external instruction.

(2) External Independent Pins Related to the RPMC

In the embodiment of the present application, the RPMC may further comprise an independent IO pin connected with the RPMC to realize the function of the RPMC. The independent IO pin connected with the RPMC is connected to another external independent pin (that is, the external independent pins related to the RPMC) of the enhanced Flash chip.

For example, in FIG. 1, IO_R_0, . . . , IO_R_0 are the external independent interfaces (i.e., pins) in the enhanced Flash chip related to the RPMC, and the IO interfaces in the RPMC connected with IO_R_0, . . . , IO_R_0 are the independent IO interfaces connected with the RPMC.

In the embodiment of the present application, an external instruction may be transmitted to the RPMC through the external independent pins in the enhanced Flash chip related to the RPMC. The controller of the RPMC may judge whether the RPMC is required to execute the external instruction. If required, the RPMC may execute the corresponding operations according to the external instruction.

In (1) External independent pins related to the FLASH and (2) External independent pins related to the RPMC set forth herein, the independent IO pin connected with the FLASH and the independent IO pin connected with the RPMC are not mutually connected.

Figure 2:
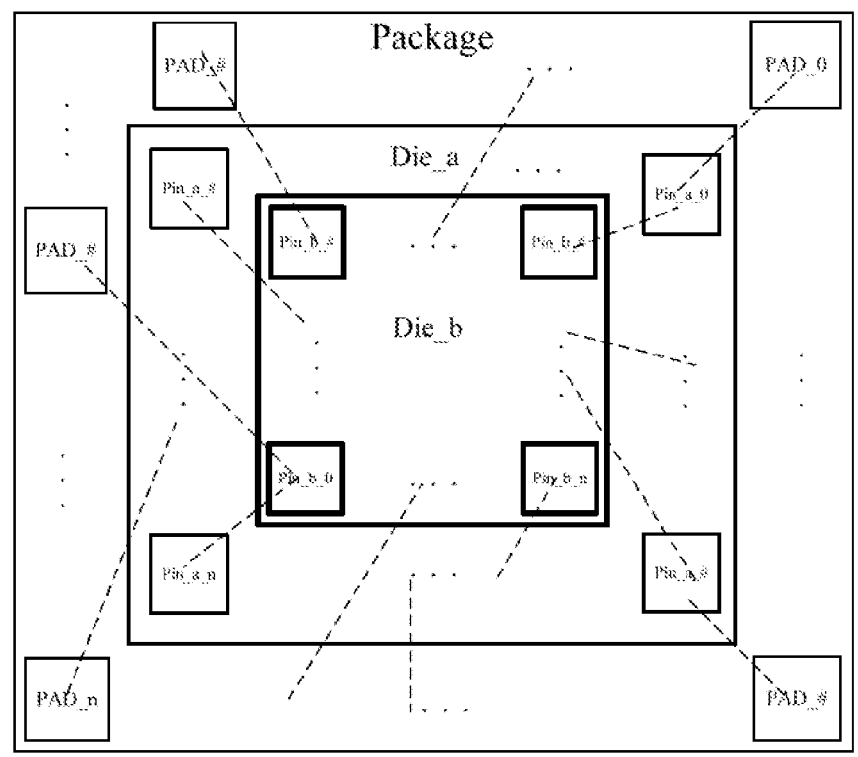
FIG. 2 is a diagram showing a packaging principle of the enhanced Flash chip according to the second embodiment of the present application.

Hereinafter, the connection between various pins will be explained in conjunction with FIG. 2. FIG. 2 is a diagram showing the packaging principle of the enhanced Flash chip according to the second embodiment of the present application.

In FIG. 2, Package indicates a package; Die_a indicates the FLASH and Die_b indicates the RPMC. The size of the FLASH is larger than that of the RPMC. In FIG. 2, PAD_0, . . . , PAD_#, . . . , PAD_n are IO pins packaged by the enhanced Flash chip, which may comprise the external sharing pins and the external independent pins; Pin_a_0, . . . , Pin_a_#, . . . , Pin_a_n are IO pins of the FLASH, which may comprise the same IO pins as those of the RPMC, the independent IO pins connected with the FLASH to realize the functions of the FLASH and the internal IO pins of the FLASH; Pin_b_0, . . . , Pin_b_#, . . . , Pin_b_n are IO pins of the RPMC, which may comprise the same IO pins as those of the FLASH, the independent IO pins connected with the RPMC to realize functions of the RPMC and the internal IO pins of the RPMC. Herein, # indicates an arbitrary number between 0 and n.

I. Connection of External Sharing Pins

In the embodiment of the present application, the same IO pins in the FLASH and the RPMC may be mutually connected and be connected to the same external sharing pins of the enhanced Flash chip. The connection may comprise:

An IO pin a_x of the FLASH is connected with the same IO pin b_y of the RPMC (the IO pin a_x of the FLASH have the same function as the IO pin b_y of the RPMC), and the IO pin a_x of the FLASH is connected to the same external sharing pin PAD_z of the enhanced Flash chip.

For example, at the upper right in FIG. 2, Pin_a_0 (that is a_x, x=0) is mutually connected to Pin_b_# (that is, b_y, y=#), and Pin_a_0 is connected to the same external sharing pin PAD_0 (that is PAD_z, z=0) of the enhanced Flash chip. At the lower right in FIG. 2, Pin_a_# (that is, a_x, x=#) is mutually connected to the same IO pin of the RPMC, and Pin_a_# is connected to the same external sharing pin PAD_#(that is PAD_z, z=#) of the enhanced Flash chip. Described above are two situations of the connection of external sharing pins.

Or, the IO pin a_x of the FLASH is mutually connected to the same IO pin b_y of the RPMC, and the same IO pin b_y of the RPMC is connected to the same external sharing pin PAD_z of the enhanced Flash chip.

For example, in FIG. 2, Pin_a_n (that is, a_x, x=n) and Pin_b_0 (that is, b_y, y=0) are mutually connected, and Pin_b_0 is connected to the same external sharing pin PAD_# (that is, PAD_z, z=#) of the enhanced Flash chip. Described above is a situation of the connection of external sharing pins.

Herein, "a" indicates an IO pin of the FLASH, "x" indicates an IO pin mark of the FLASH, x=0, 1, . . . , n; "b" indicates an IO pin of the RPMC, "y" indicates an IO pin mark of the RPMC, y=0, 1, . . . , n; and "PAD" indicates an IO pin packaged by the enhanced Flash chip, and "z" indicates an IO pin mark of the IO pin packaged by the enhanced Flash chip, z=0, 1, . . . , n.

II. Connection of the Pairs of the Internal IO Pins

An internal IO pin of the FLASH and an internal IO pin of the RPMC are mutually connected. The connection may comprise: the internal IO pin a_x of the FLASH is connected to the internal IO pin b_y of the RPMC. Herein, the internal IO pin a_x of the FLASH and the internal IO pin b_y of the RPMC may indicate the same status bit.

For example, in FIG. 2, Pin_a_# (that is, a_x, x=#) and the internal IO pin in the RPMC are mutually connected, and Pin_b_n (that is, b_y, y=n) and the internal IO pin in the FLASH are mutually connected. Described above are two situations of the mutual connection between the internal IO pin in the FLASH and the internal IO pin in the RPMC.

III. Connection of the External Independent Pins (i) The independent IO pin connected with the FLASH is connected to the external independent pin of the enhanced Flash chip. The connection may comprise: IO pin a_x of the FLASH is connected to the external independent pin PAD_z of the enhanced Flash chip.

For example, at the lower left in FIG. 2, an independent IO pin a_x connected with the FLASH is connected to an external independent pin PAD_n of the chip (that is, PAD_z, z=n) of the enhanced Flash chip.

(ii). The independent IO pin connected with the RPMC is connected to another external independent pin of the enhanced Flash chip. The connection may comprise: IO pin b_y of the RPMC is connected to the external independent pin PAD_z of the enhanced Flash chip.

For example, in FIG. 2, the independent IO pin Pin_b_# (that is, b_y, y=#) connected with the RPMC is connected to the external independent pin PAD_# (that is, PAD_z, z=#) of the enhanced Flash chip.

Detailed description of connection of remainder pins in FIG. 2 will not be provided in the embodiment of the present application.

Finally, it should be explained that although the FLASH and the RPMC in FIG. 2 are packaged in vertical stack, in the enhanced Flash chip, the FLASH and the RPMC can also be packaged side by side. The embodiment of the present application should not be limited thereto. Moreover, when the FLASH and the RPMC are packaged in vertical stack, if the size of the FLASH is larger than that of the RPMC, then the RPMC will be vertically stacked on the FLASH; if the size of the RPMC is larger than that of the FLASH, the FLASH will be vertically stacked on the RPMC. That is, in FIG. 2, it is also feasible that Die_a is the RPMC and Die_b is the FLASH.

The embodiment of the present application proposes an enhanced FLASH chip that can realize the function of the RPMC by a multi-chip package method, in which on the basis of the FLASH chip, the RPMC and the FLASH chip are packaged integrally to hence constitute an enhanced Flash chip with RPMC function, such that the RPMC and the FLASH are allowed to share common pins. The embodiment of the present application may reduce the complexity and the cost of chip design. Further, an internal mutual communication between the FLASH and the RPMC can be performed through a pair of mutually connected internal IO pins, whereby ensuring the synchronization between the RPMC and the FLASH. Moreover, in the embodiment of the present application, the FLASH and the RPMC may also execute different instructions simultaneously, that is, the FLASH and the RPMC can be operated in parallel, in such a manner that the performance of the chip could be improved.

Third Embodiment

Hereinafter, the specific method for packaging the chip will be explained by way of the third embodiment of the present application.

Figure 3:
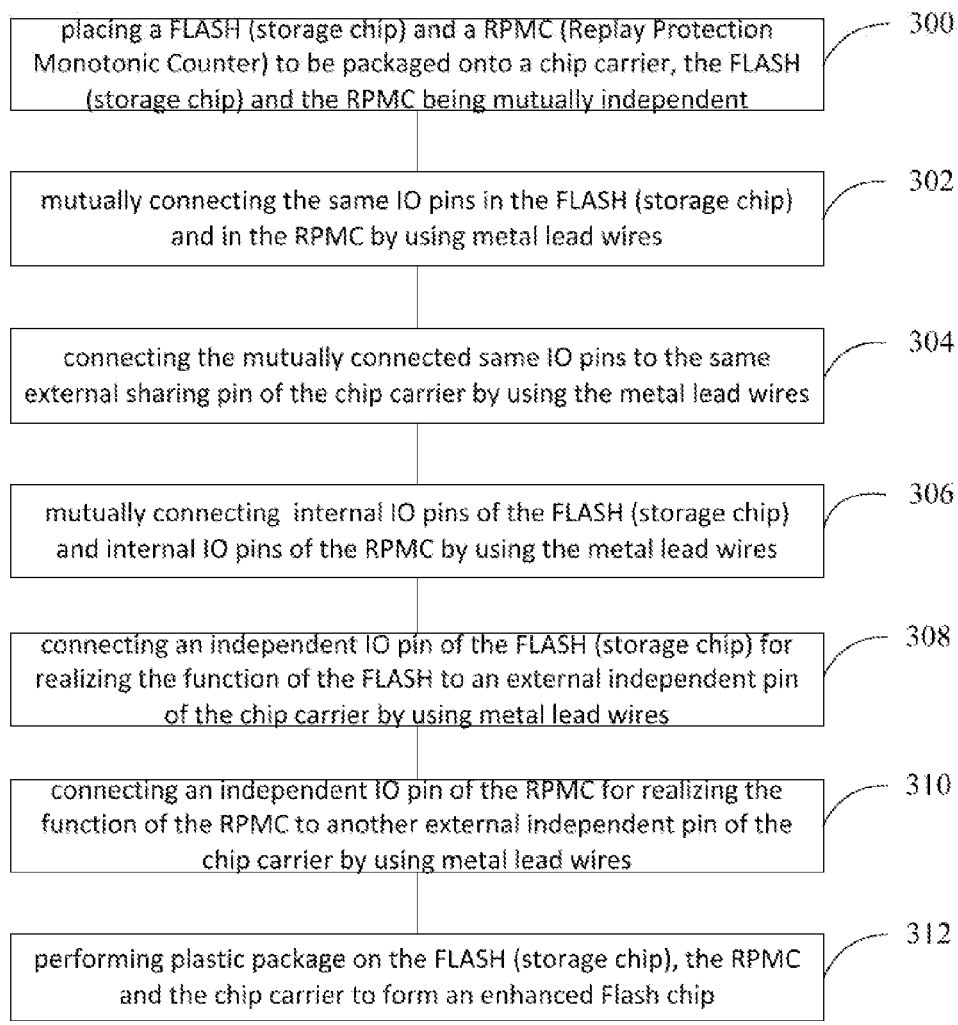
FIG. 3 is a flow chart of a method for packaging chip according to a third embodiment of the present application.

FIG. 3 shows a flow chart of the method for packaging chip according to the third embodiment of the present application. The method for packaging chip may comprise the following steps of.

Step 300: placing FLASH and a RPMC (Replay Protection Monotonic Counter) to be packaged onto a chip carrier, the FLASH and the RPMC being mutually independent.

In the embodiment of the present application, the FLASH and the RPMC are substantially packaged integrally so as to obtain the enhanced Flash chip having the function of the RPMC, wherein the FLASH and the RPMC are mutually independent in the enhanced Flash chip.

First, the FLASH and the RPMC to be packaged may be placed onto the chip carrier. The chip carrier in this embodiment of the present application may correspond to Package in FIG. 2.

Preferably, Step 300 may comprise: placing the FLASH and the RPMC onto the chip carrier side by side, or vertically stacking the FLASH and the RPMC on the chip carrier.

FIG. 2 shows the packaging principle of vertically stacking the FLASH and the RPMC on the chip carrier.

In the embodiment of the present application, when the FLASH and the RPMC are vertically stacked on the chip carrier,
if the size of the FLASH is larger than that of the RPMC, then the RPMC may be vertically stacked on the FLASH;
if the size of the RPMC is larger than that of the FLASH, then the FLASH may be vertically stacked on the RPMC.

Step 302: mutually connecting the same IO pins in the FLASH and the RPMC by using metal lead wires.

In the embodiment of the present application, there are some same IO pins (same functions) in the FLASH and the RPMC, which could be mutually connected by using the metal lead wires. Particularly, the IO pin a_x of the FLASH could be connected with the same IO pin b_y in the RPMC by using the metal lead wires.

Step 304: connecting the mutually connected same IO pins to the same external sharing pin of the chip carrier by using the metal lead wires.

Preferably, the Step 304 may comprise: connecting the IO pin a_x of the FLASH to the same external sharing pin PAD_z of the chip carrier by using the metal lead wires, or connecting the same IO pin b_y of the RPMC to the same external sharing pin PAD_z of the chip carrier by using the metal lead wires.

Herein, the IO pin a_x of the FLASH and the IO pin b_y of the RPMC are the mutually connected same IO pins.

Herein "a" indicates an IO pin of the FLASH, "x" indicates an IO pin mark of the FLASH; "b" indicates an IO pin of the RPMC and "y" indicates an IO pin mark of the RPMC; "PAD" indicates an IO pin packaged by the chip and "z" indicates an IO pin mark of the IO pin packaged by the chip.

The Step 302-Step 304 can be combined to be a situation of the connection of the external sharing pins. For example, at the upper right in FIG. 2, Pin_a_0 (that is a_x, x=0) and Pin_b_# (that is, b_y, y=#) are mutually connected, Pin_a_0 is connected to the same external sharing pin PAD_0 (that is, PAD_z, z=0) of the chip; at the lower right in FIG. 2, Pin_a_# (that is, a_x, x=#) and the same IO pins in the RPMC are mutually connected, Pin_a_# is connected to the same external sharing pin PAD_# (that is PAD_z, z=#) of the chip; and in FIG. 2, Pin_a_n (that is, a_x, x=n) and Pin_b_0 (that is, b_y, y=x) are mutually connected, and Pin_b_0 is connected to the same external sharing pin PAD_# (that is, PAD_z, z=#) of the chip. Described above are the situations of the connection of external sharing pins.

The dotted lines for connecting two pins in FIG. 2 may represent the metal lead wires in the embodiment of the present application.

Step 306: mutually connecting an internal IO pin of the FLASH and an internal IO pin of the RPMC by using the metal lead wires.

In the embodiment of the present application, the FLASH and the RPMC may further comprise internal IO pins, respectively. The internal IO pin a_x of the FLASH may be connected to the internal IO pin b_y of the RPMC by using metal lead wires. Herein, the internal IO pin a_x of the FLASH and the internal IO pin b_y of the RPMC may indicate the same status bit.

For example, in FIG. 2, Pin_a_# (that is, a_x, x=#) is mutually connected to the internal IO pin in the RPMC through metal lead wires, and Pin_b_n (that is, b_y, y=n) is mutually connected to the internal IO pin in the FLASH through metal lead wires. Described above are two situations of the mutual connection between the internal IO pin of the FLASH and the internal IO pin of the RPMC by using metal lead wires.

Step 308: connecting an independent IO pin in the FLASH for realizing the function of the FLASH to an external independent pin of the chip carrier by using metal lead wires.

In the embodiment of the present application, the FLASH may further comprise the independent IO pins for realizing the function of the FLASH, which could be connected to the external sharing pins of the chip carrier by using metal lead wires.

For example, at the lower left in FIG. 2, the independent IO pin Pin_a_x connected with the FLASH is connected to the external independent pin PAD_n (that is, PAD_z, z=n) of the chip by using metal lead wires.

Step 310: connecting an independent IO pin of the RPMC for realizing the function of the RPMC to another external independent pin of the chip carrier by using metal lead wires.

Similarly, the RPMC can further comprise the independent IO pin for realizing the function of the RPMC, which could be connected to another external sharing pin of the chip carrier by using metal lead wires.

For example, in FIG. 2, the independent IO pin Pin_b_n (that is, b_, y=n) connected with the RPMC is connected to the external independent pin PAD_z of the chip by using metal lead wires.

Herein, the independent IO pin in the FLASH is not mutually connected to the independent IO pin in the RPMC.

Step 312: performing plastic package on the FLASH, the RPMC and the chip carrier to form an enhanced Flash chip having the function of the RPMC.

After the Step 300-Step 310, the placement of the FLASH and the RPMC and the connections of various pins on the chip are completed. Finally, the plastic package is performed on the FLASH, the RPMC and the chip carrier to form the enhanced Flash chip having the function of the RPMC. Upon the plastic package, the package of the chip is finished.

Fourth Embodiment

The present application also provides a computer readable recording medium in which a program used to execute the method shown in FIG. 3 is recorded.

The computer readable recording medium comprises any mechanism used to store or transmit information in a readable format by a computing device (for example, computer). For example, the machine readable medium may comprise read-only memory (ROM), random access memory (RAM), disc storage medium, optical storage medium, electric, light, sound and other formats of transmitting signal (for example, carrier wave, infrared signal, digital signal, etc.), etc.

In summary, the embodiments of the present application may have advantages as follows:

1. The enhanced Flash chip proposed by the embodiments of the present application is to integrally package the FLASH and the RPMC, wherein, the FLASH circuit and the RPMC circuit respectively comprise an independent controller; the same IO pins of the FLASH, and the RPMC are mutually connected and connected to the same external sharing pins of the enhanced Flash chip; an external instruction is transmitted to the FLASH and the RPMC through the external sharing pins of the enhanced Flash chip, and the controller of the FLASH and the controller of the RPMC respectively judge whether to execute the external instruction; and the FLASH and the RPMC further comprise internal IO pins, respectively, in which the internal IO pin of the FLASH is connected with the same internal IO pin of the RPMC, and the internal mutual communication between the FLASH and the RPMC is performed through a pair of mutually connected internal IO pins. In the embodiments of the present application, since the FLASH and the RPMC are packaged integrally, the package size and the design cost can be reduced; moreover, since the existing FLASH chips can be reused as the circuit modules of the FLASH and the designer only needs to design RPMC circuit modules, it is possible to reduce the complexity of chip design, shorten the design period and reduce the cost.

2. The internally mutual communication between the FLASH and the RPMC can be performed through a pair of mutually connected internal IO pins. Thus, when either one of the FLASH and the RPMC is executing the external instruction while the other one is idle, if a suspend instruction is received through the external sharing pins, then the one which is executing the external instruction will execute the suspend instruction and will send a notification of its suspension to other one which is idle through the pair of mutually connected internal IO pins, such that the other one which is idle will also execute the suspend instruction, whereby ensuring the synchronization between the FLASH and the RPMC.

3. The FLASH and the RPMC may also execute different instructions simultaneously, that is, the FLASH and the RPMC can be operated in parallel, in such a manner that the performance of the chip could be improved.

4. The FLASH and the RPMC made by different processes can be integrally packaged in a manner of multi-chip packaging, such that the existing resources can be reused so as to reduce the development cost.

5. The capacity of the FLASH is extendable; for example, the capacity of a single FLASH could be increased, or a plurality of FLASH could be packaged integrally.

Each embodiment in the specification is described step by step. Each embodiment only emphasizes the differences from other embodiments. Same or similar parts between various embodiments can refer to each other.

For simply descriptive purpose, the aforementioned embodiments of the method have been described as a combination of a series of actions. However, the person skilled in the art should understand that the present application is not limited by the sequence of the described actions but some of steps can be implemented in other sequence or simultaneously according to the present application. Further, the person skilled in the art should also understand that the embodiments described in the specification are all preferred embodiments and the actions and modules involved in are not necessarily required in the present application.

Finally, it also should be explained that, in the present application, the relational terms such as first, second are used only to discriminate one entity or operation from another entity or operation rather than to necessarily require or imply the actual existence of any relation or sequence between these entities or actions. Moreover, the terms "comprise", "include" or any other similar variety are intended to cover all non-exclusive comprising, in order that the courses, methods, items or equipments comprising a series of factors shall encompass not only factors described herein but also other factors that are not listed explicitly, or further encompass the inherent factors of these courses, methods, items or equipments. Unless definitely specified, the factor defined by the wording "comprises one . . . " shall not exclude any other same factor in the courses, methods, items or equipments comprising the factor described herein.

The enhanced Flash chip and the method for packaging chips have been described in detail in the embodiments of the present application. In the present application, the specific examples are provided to describe the principle and the implementation manner of the present application. The descriptions of the embodiments as above are used only to help understanding the methods and main concept of the present application; meanwhile, modifications may be made by an ordinary person skilled in the art according to the concept of the present application within the scope of specific embodiments and applications. Therefore, the contents of the specification should not be constructed as any limiting on the present application.

The invention claimed is:

1. An enhanced Flash chip, comprising:
   a FLASH and a RPMC (Replay Protection Monotonic Counter) which are packaged integrally, wherein,
   the FLASH comprises an independent controller and the RPMC comprises an independent controller respectively;
   the same IO pins in the FLASH and in the RPMC are mutually connected, and are connected to same external sharing pin(s) of the enhanced Flash chip;
   an external instruction is transmitted to the FLASH and the RPMC through the external sharing pin(s) of the enhanced Flash chip, and the controller of the FLASH and the controller of the RPMC respectively judge whether to execute the external instruction; and the FLASH further comprises internal IO pin(s) and the RPMC further comprises internal IO pin(s) respectively, the internal IO pin(s) of the FLASH and the internal IO pin(s) of the RPMC are mutually connected, and internal mutual communication between the FLASH and the RPMC is performed through the pair of mutually connected internal IO pins.

2. The enhanced Flash chip according to claim 1, wherein, when the enhanced Flash chip receives a first external instruction through the external sharing pin(s), if the controller of the FLASH and the controller of the RPMC respectively judge that the FLASH and the RPMC both are required to execute the first external instruction, then the FLASH and the RPMC execute corresponding operation according to the first external instruction respectively;

if either one of the FLASH and the RPMC is required to execute the first external instruction, then during one of the FLASH and the RPMC executes the corresponding operation according to the first external instruction, if the enhanced Flash chip receives a second external instruction through the external sharing pin(s) which needs to be executed by the other one of the FLASH and the RPMC, then the other one of the FLASH and the RPMC executes corresponding operation according to the second external instruction.

3. The enhanced flash chip according to claim 2, wherein, when the flash is executing the external instruction and the RPMC is idle, if the enhanced Flash chip receives a suspend instruction through the external sharing pin(s), then the controller of the FLASH judges that the FLASH is required to execute the suspend instruction, the controller of the RPMC judges that the RPMC is not required to execute the suspend instruction; and after suspending the operation being executed according to the suspend instruction, the FLASH sends a notification of the suspension to the RPMC through the pair of mutually connected internal IO pins, and after receiving the notification, the RPMC executes the suspend instruction to realize synchronization with the FLASH.

4. The enhanced Flash chip according to claim 1, wherein, when the FLASH is executing the external instruction and the RPMC is idle, if the enhanced Flash chip receives a suspend instruction through the external sharing pin(s), then the controller of the FLASH judges that the FLASH, is required to execute the suspend instruction, the controller of the RPMC judges that the RPMC is not required to execute the suspend instruction; and after suspending the operation being executed according to the suspend instruction, the FLASH sends a notification of the suspension to the RPMC through the pair of mutually connected internal IO pins, and after receiving the notification, the RPMC executes the suspend instruction to realize synchronization with the FLASH.

5. The enhanced Flash chip according to claim 1, wherein, the mutually connected internal IO pins refers to a plurality of the pairs of mutually connected internal IO pins; and the external sharing pin(s) of the enhanced Flash chip refers to a plurality of the external sharing pins.

6. The enhanced Flash chip according to claim 1, wherein, the FLASH further comprises an independent IO pin connected with the FLASH to realize the function of the FLASH, and the independent IO pin connected with the FLASH is connected to an external independent pin of the enhanced Flash chip; and the RPMC further comprises an independent IO pin connected with the RPMC to realize the function of the RPMC, and the independent IO pin connected with the RPMC is connected to another external independent pin of the enhanced Flash chip, wherein, the independent IO pin connected with the FLASH and the independent IO pin connected with the RPMC are not mutually connected.

7. The enhanced Flash chip according to claim 1, wherein, the same IO pins in the FLASH and in the RPMC being mutually connected, and being connected to same external sharing pin(s) of the enhanced Flash chip, comprises:

the IO pin a_x of the FLASH is mutually connected to the same IO pin b_y of the RPMC, and the IO pin a_x of the FLASH is connected to the same external sharing pin PAD_z of the enhanced Flash chip, or the same ID pin b_y of the RPMC is connected to the same external sharing pin PAD_z of the enhanced Flash chip, wherein, "a" indicates an IO pin, of the FLASH, "x" indicates an IO pin mark of the FLASH; "b" indicates an IO pin of the RPMC and "y" indicates an IO pin mark of the RPMC; "PAD" indicates an IO pin packaged by the enhanced Flash chip and "z" indicates an IO pin mark of the IO pin packaged by the enhanced Flash chip.

8. A method for packaging chip, comprising:

placing a FLASH and a RPMC (Replay Protection Monotonic Counter) to be packaged onto a chip carrier, the FLASH and the RPMC being mutually independent;

mutually connecting the same IO pins in the FLASH and in the RPMC by using metal lead wires;

connecting the mutually connected same IO pins to same external sharing pin(s) of the chip carrier by using metal lead wires;

mutually connecting internal IO pin(s) of the FLASH and internal IO pin(s) of the RPMC by using metal lead wire(s); and performing plastic package on the FLASH, the RPMC and the chip carrier to form a chip having the function of the RPMC.

9. The method for packaging chip according to claim 8, wherein, the method further comprises:

connecting an independent IO pin in the FLASH for realizing the function of the FLASH to an external independent pin of the chip carrier by using metal lead wire(s); and connecting an independent IO pin of the RPMC for realizing the function of the RPMC to another external independent pin of the chip carrier by using metal lead wire(s), wherein, the independent IO pin of the FLASH is not connected with the independent IO pin of the RPMC.

10. The method for packaging chip according to claim 9, wherein, the step of connecting the mutually connected same IO pins to the same external sharing pin(s) of the chip carrier by using metal lead wires, comprises:

connecting the JO pin a_x of the FLASH to the same external sharing pin PAD_z of the chip carrier by using metal lead wire(s), or connecting the same IO pin b_y of the RPMC to the same external sharing pin PAD_z of the chip carrier by using metal lead wire(s), wherein, the JO pin a_x of the FLASH and the IO pin b_y of the RPMC are mutually connected same IO pins, and "a" indicates an IO pin of the FLASH, "x" indicates an IO pin mark of the FLASH; "b" indicates an TO pin of the RPMC and "y" indicates an IO pin mark of the RPMC; "PAD" indicates an IO pin packaged by the enhanced Flash chip and "z" indicates an IO pin mark of the IO pin packaged by the enhanced Flash chip.

11. The method for packaging chip according to claim 9, wherein, the step of placing a FLASH and a RPMC to be packaged onto a chip carrier, comprises:
    placing the FLASH and the RPMC onto the chip carrier side by side, or vertically stacking the FLASH and the RPMC on the chip carrier;
    when the FLASH and the RPMC are vertically stacked on the chip carrier,
    if the size of the FLASH is larger than that of the RPMC, then the RPMC is vertically stacked on the FLASH; and
    if the size of the RPMC is larger than that of the FLASH, then the FLASH is vertically stacked on the RPMC.

12. The method for packaging chip according to claim 8, wherein, the step of connecting the mutually connected same IO pins to the same external sharing pin(s) of the chip carrier by using metal lead wires, comprises:
    connecting the IO pin a_x of the FLASH to the same external sharing pin PAD_z of the chip carrier by using metal lead wire(s), or connecting the same IO pin b_y of the RPMC to the same external sharing pin PAD_z of the chip carrier by using metal lead wire(s),
    wherein, the IO pin a_x of the FLASH and the IO pin b_y of the RPMC are mutually connected same IO pins, and "a" indicates an IO pin of the FLASH, "x" indicates an IO pin mark of the FLASH; "b" indicates an IO pin of the RPMC and "y" indicates an IO pin mark of the RPMC; "PAD" indicates an IO pin packaged by the enhanced Flash chip and "z" indicates an IO pin mark of the JO pin packaged by the enhanced Flash chip.

13. The method for packaging chip according to claim 8, wherein, the step of placing a FLASH and a RPMC to be packaged onto a chip carrier, comprises:
    placing the FLASH and the RPMC onto the chip carrier side by side, or vertically stacking the FLASH and the RPMC on the chip carrier;
    when the FLASH and the RPMC are vertically stacked on the chip carrier,
    if the size of the FLASH is larger than that of the RPMC, then the RPMC is vertically stacked on the FLASH; and
    if the size of the RPMC is larger than that of the FLASH, then the FLASH is vertically stacked on the RPMC.

\* \* \* \* \*